US006077646A

United States Patent [19]

Verschueren et al.

[11] Patent Number: 6,077,646

[45] **Date of Patent: *Jun. 20, 2000**

[54] HEAT MODE RECORDING MATERIAL AND METHOD FOR PRODUCING DRIOGRAPHIC PRINTING PLATES

[75] Inventors: Eric Verschueren, Merksplas; Joan Vermeersch, Deinze; Jean Van Trier, Sint-Amands, all of Belgium

[73] Assignee: Agfa-Gevaert, N.V., Mortsel, Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 08/929,116

[22] Filed: Sep. 15, 1997

Related U.S. Application Data

[60] Provisional application No. 60/031,131, Nov. 18, 1996.

[30] Foreign Application Priority Data

Sep. 18, 1996 [EP] European Pat. Off. ............. 96 202602

[51] Int. Cl.[7] .......... G03F 7/11

[52] U.S. Cl. .......... 430/272.1; 430/303

[58] Field of Search .......... 430/272.1, 273.1, 430/303, 271.1

[56] References Cited

U.S. PATENT DOCUMENTS

| | | | |
|---|---|---|---|
| 4,631,246 | 12/1986 | Bennett | 430/271 |
| 5,378,580 | 1/1995 | Leenders | 430/303 |
| 5,496,677 | 3/1996 | Toyama et al. | 430/162 |
| 5,536,619 | 7/1996 | Verburgh | 430/273.1 |
| 5,780,202 | 7/1998 | Nagahara et al. | 430/271.1 |
| 5,830,620 | 11/1998 | Harada et al. | 430/272.1 |

*Primary Examiner*—Kathleen Duda
*Attorney, Agent, or Firm*—Breiner & Breiner

[57] ABSTRACT

The present invention provides a heat mode recording material comprising on a side of a support having an oleophilic surface (i) a recording layer containing a light-to-heat converting substance capable of converting radiation into heat and (ii) an oleophobic surface layer, wherein said oleophobic surface layer and said recording layer may be the same layer and on another side of the support a backing layer, characterized in that the maximum roughness depth $R_t$ of the surface layer is at least 0.65 $\mu$m and/or the maximum roughness depth of the outer back layer is at least 1.20 $\mu$m.

3 Claims, No Drawings

HEAT MODE RECORDING MATERIAL AND METHOD FOR PRODUCING DRIOGRAPHIC PRINTING PLATES

DESCRIPTION

This Application claims the benefit of U.S. Provisional No. 60/031,131 filed Nov. 18, 1996.

FIELD OF THE INVENTION

The present invention relates to a heat mode recording material for making a lithographic printing plate for use in lithographic printing without dampening. The present invention further relates to a method for imaging said heat mode recording material by means of a laser.

BACKGROUND OF THE INVENTION

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called wet printing plates, both water or an aqueous dampening liquid and ink are applied to the plate surface that contains hydrophilic and hydrophobic areas. The hydrophilic areas will be soaked with water or the dampening liquid and are thereby rendered oleophobic while the hydrophobic areas will accept the ink. A second type of lithographic printing plates operates without the use of a dampening liquid and are called driographic printing plates. This type of printing plates comprise highly ink repellant areas and oleophilic areas. Generally the highly ink repellant areas are formed by a silicon layer.

Driographic printing plates can be prepared using a photographic material that is made image-wise receptive or repellant to ink upon photo-exposure of the photographic material. However heat mode recording materials, the surface of which can be made image-wise receptive or repellant to ink upon image-wise exposure to heat and/or subsequent development are also known for preparing driographic printing plates.

For example in DE-A-2512038 there is disclosed a heat mode recording material that comprises on a support carrying or having an oleophilic surface (i) a heat mode recording layer containing a self oxidizing binder e.g. nitrocellulose and a substance that is capable of converting radiation into heat e.g. carbon black and (ii) a non-hardened silicon layer as a surface layer. The disclosed heat mode recording material is image-wise exposed using a laser and is subsequently developed using a developing liquid that is capable of dissolving the silicon layer in the exposed areas. Subsequent to this development the silicon surface layer is cured. Due to the use of naphta as a developing liquid the process is ecologically disadvantageous. Further since the surface layer is not hardened the heat mode recording material may be easily damaged during handling.

FR-A-1.473.751 discloses a heat mode recording material comprising a substrate having an oleophilic surface, a layer containing nitrocellulose and carbon black and a silicon layer. After image-wise exposure using a laser the imaged areas are said to be rendered oleophilic. The decomposed silicon layer is not removed. Ink acceptance of the obtained plates is poor and the printing properties such as printing endurance and resolution of the copies is rather poor.

Research Disclosure 19201 of april 1980 discloses a heat mode recording material comprising a polyester film support provided with a bismuth layer as a heat mode recording layer and a silicon layer on top thereof. The disclosed heat mode recording material is imaged using an Argon laser and developed using hexane.

EP-A-573091 discloses a method for making a lithographic printing plate requiring a heat mode recording material comprising on a support having an oleophilic surface (i) a recording layer having a thickness of not more than 3 μm and containing a substance capable of converting the laser beam radiation into heat and (ii) a cured oleophobic surface layer and wherein said recording layer and oleophobic surface layer may be the same layer.

From the above it can be seen that a number of proposals have been made for making a driographic printing plate using a heat mode recording material. All these plates have the disadvantage that they exhibit blocking. This results in difficulties in all steps wherein said materials are transported such as the winding-up during the fabrication, the format cutting and the packaging, the automatic loading on the press, the transport through the irradiation station, etc.

SUMMARY OF THE INVENTION.

It is an object of the present invention to provide an alternative heat mode recording material for making a driographic printing plate of high quality that exhibits less blocking.

It is a further object of the present invention to provide a method for obtaining a driographic printing plate of high quality using a heat mode recording material that exhibits less blocking.

Further objects of the present invention will become clear from the description hereinafter.

According to the present invention there is provided a heat mode recording material comprising on a side of a support having an oleophilic surface (i) a recording layer containing a light-to-heat converting substance capable of converting radiation into heat and (ii) an oleophobic surface layer, wherein said oleophobic surface layer and said recording layer may be the same layer and on another side of the support a backing layer, characterized in that the maximum roughness depth $R_t$ of the surface layer is at least 0.65 μm and/or the maximum roughness depth of the outer back layer is at least 1.20 μm.

According to the present invention there is also provided a method for making a lithographic printing plate requiring no dampening liquid comprising the steps of:

- image-wise exposing using a laser beam a heat mode recording material as described above
- developing the exposed heat mode recording material thereby removing said oleophobic surface layer in the exposed areas so that the underlying oleophilic surface is exposed.

DETAILED DESCRIPTION OF THE INVENTION.

It has been found that the above described heat mode recording material exhibits a lowered blocking when the maximum roughness depth $R_t$ of the surface layer is at least 0.65 μm and/or the maximum roughness depth of the outer back layer is at least 1.20 μm, what leads to an easier production and use of said material and to printing plates which are improved in regard to their physical properties (less wrinkles).

The profile of an outer layer is measured with a perthometer Mahr Perthen S6P containing as measuring head RTK 50 (tradenames of Feinpruef Perthen GmbH, Goettingen, Germany) equipped with a diamond stylus with a diameter of 5 μm under a pressure of 1.0 mN according to techniques well known in the art.

The sampling length $L_s$ which is the reference length for roughness evaluation measures 0.25mm. The evaluation length $L_m$, being that part of the traversing length $L_t$ which is evaluated for acquiring the roughness profile R contains standard 5 consecutive sampling lengths. The traversing length $L_t$ is the overall length travelled by the tracing system when acquiring the roughness profile. The maximum roughness depth $R_t$ is the perpendicular distance between the highest and the lowest point of the roughness profile R.

With back side of said material is meant that side of the material in regard to the support which does not carry the oleophobic surface layer where with front side is meant that side of the material in regard to the support that carries the oleophobic surface layer.

Preferably the maximum roughness depth $R_t$ of the surface layer is at least 0.7 μm.

In order to obtain the maximum roughness depth $R_t$ of the outer backside layer the support of the heat mode recording material is treated with a back side coating. In order to increase the maximum roughness depth $R_t$ of the outer frontside layer there is added a matting agent to the oleophobic surface layer.

A preferred back side coating according to the invention contains between 175 and 750 mg/m$^2$ gelatin, between 50 and 1000 mg/m$^2$ colloidal silica with a surface area of at least 100 m$^2$/gr, more preferably at least 300 m$^2$/gr and between 1 and 100 mg/m$^2$ of amorphous silica, preferably with a diameter between 1 and 10 μm.

Another preferred back side coating according to the invention comprises between 100 and 500 mg/m$^2$ of a polymethyl-methacrylate latex (particles diameter preferably between 25 and 300 nm), between 5 and 50 mg/m$^2$ colloidal silica with a surface area of at least 100 m$^2$/gr, between 3 and 30 mg/m$^2$ of a polyethylene wax, between 3.1 and 12 mg/m$^2$ of polystyrene sulphonic acid, between 0.9 and 4 mg/m$^2$ of poly(3,4-ethylenedioxy-thiophene) and between 10 and 100 mg/m$^2$ of polymethyl-methacrylate matting agent (preferably with a diameter between 2 and 10 μm).

Still another preferred back side coating according to the invention comprises PVA, $TiO_2$ and hydrolyzed tetraalkyl orthosilicate, wherein $SiO_2$ constitutes between 7 and 30 weight % of the total weight of said matrix, $TiO_2$ constitutes between 63 and 83 weight % of the total weight of said matrix and PVA constitutes between 7 and 30 weight % of the total weight of said matrix. The total weight of said matrix lies between 5 and 10 g/m$^2$. To said matrix can be added in an amount between 3 and 500 mg/m$^2$ a matting agent such as starch, silicium oxide, silicates, glass pearls, toner particles.

A matting agent added to the oleophobic surface layer in order to obtain the required maximum roughness depth $R_t$ may be an organic polymer or copolymer such as a copolymer of acrylic acid and methyl acrylate or a copolymer of styrene, methyl-methacrylate and maleic acid. More preferably said matting agent is an inorganic compound such as silica or a silicate.

Said matting agent has a weight average diameter of at least 2 μm, more preferably of at least 3 μm, most preferably, of at least 4 μm. The maximum weight average is not so important but is for practical reasons less than 100 μm, more preferably less than 60 μm.

In accordance with the invention said oleophobic surface layer preferably comprises at least 30mg/m$^2$ of a matting agent with a weight average diameter of at least 2 Km, more preferably between 50 and 1000 mg/m$^2$ of said matting agent, most preferably between 75 and 500 mg/m$^2$ of said matting agent.

Suitable supports for the heat mode recording material used in connection with the present invention are preferably non-metallic flexible supports having an oleophilic surface e.g. a polyester film support such as poly(ethylene terephthalate) film or poly(ethylene naphthalenedicarboxylate) film, paper coated with a polyolefin such as polyethylene, polycarbonate film, polystyrene film etc. However a metallic support such as e.g. aluminium can also be used in connection with the present invention. In case the surface of the support is not or insufficiently oleophilic it may be provided with an oleophilic layer.

According to a preferred embodiment of the present invention the heat mode recording material contains a separate heat mode recording layer containing the heat converting substance comprised between the support and the oleophobic surface layer. Examples of substances capable of converting radiation into heat are e.g. carbon black, infrared or near infrared absorbing dyes or pigments, metals such as Bi, Sn, Te etc. or a combination thereof. Suitable infrared dyes are disclosed in e.g. U.S. Pat. No. 4833124, EP-321923, U.S. Pat. No. 4772583, U.S. Pat. No. 4942141, U.S. Pat. No. 4948776, U.S. Pat. No. 4948777, U.S. Pat. No. 4948778, U.S. Pat. No. 4950639, U.S. Pat. No. 4950640, U.S. Pat. No. 4912083, U.S. Pat. No. 4952552, U.S. Pat. No. 5024990, U.S. Pat. No. 5023229 etc. Suitable infrared pigments are e.g. HEUCODOR metal oxide pigments available from Heubach Langelsheim. When a metal such as e.g. bismuth is used as a heat converting substance the recording layer is preferably a vacuum deposited metal layer.

According to the present invention the thickness of the recording layer is preferably not more than 3 μm in order to obtain a printing plate of acceptable quality, more preferably the thickness will be less than 2.5 μm. Typically the recording layer preferably has a thickness between 15 nm and 1.5 μm. The preferred maximum thickness of 3 μm of the recording layer is especially important when exposure is carried out through the support.

According to a particular embodiment of the present invention the recording layer may be a vacuum deposited aluminium layer. The thickness of such an aluminium layer however should be less than 25 nm and more preferably between 10 nm and 22,5 nm. When the thickness of the aluminium recording layer becomes too large the heat mode recording material in connection with the present invention cannot be imaged.

The heat mode recording layer used in connection with the present invention may contain a binder e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly (meth)acrylates, polyvinyl chloride, silicone resin etc. The recording layer may further contain other ingredients such as e.g. wetting agents, matting agents, anti-oxidizing agents etc. Preferably the heat mode recording layer contains a polymer containing covalently bound chlorine. Alternatively part or all of this polymer may be contained in a separate layer located adjacent to the heat mode recording layer and most preferably between the support and the heat mode recording layer.

The heat mode recording layer in connection with the present invention may be hardened. For example a nitrocellulose layer hardened with an isocyanate or a melamine may be used.

It has been found that when a polymer containing covalently bound chlorine is contained in the heat mode recording layer of a recording material or in an adjacent layer the speed of the recording material can be improved.

Suitable chlorine containing polymers for use in accordance with the present invention are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride and vinyl acetate, a copolymer of butylacrylate, vinyl acetate and vinyl chloride or vinylidene chloride, a copolymer of vinyl chloride, vinylidene chloride and itaconic acid, a copolymer of vinyl chloride, vinyl acetate and vinyl alcohol, chlorinated polyethylene, polychloroprene and copolymers therof, chlorosulfonated polyethylene, polychlorotrifluoroethylene, polymethyl-alpha-chloroacrylate etc.

The chlorine containing polymer used in connection with the present invention may be prepared by various polymerization methods of the constituting monomers. For example, the polymerization may be conducted in aqueous dispersion containing a catalyst and activator, e.g., sodium persulphate and meta sodium bisulphite, and an emulsifying and/or dispersing agent. Alternatively, the homopolymers or copolymers used with the present invention may be prepared by polymerization of the monomeric components in the bulk without added diluent, or the monomers may be reacted in appropriate organic solvent reaction media. The total catalyst-activator concentration should generally be kept within a range of about 0.01% to about 2.0% by weight of the monomer charge, and preferably within a range of concentration of 0.1% to 1.0%. Improved solubility and viscosity values are obtained by conducting the polymerization in the presence of mercaptans such as ethyl mercaptan, lauryl mercaptan, tertiary dodecyl mercaptan, etc., which are effective in reducing cross-linking in the copolymer. In general, the mercaptans should be used in concentrations of 0.1% to 5.0% by weight, based on the weight of polymerizable monomers present in the charge.

Alternatively the chlorine containing polymer may be prepared by chlorinating homopolymers or copolymers. For example chlorinated rubbers such as polychloroprene may be prepared by reacting a rubber with chlorine gas. In a similar manner chlorinated polyethylene may be prepared.

According to an alternative embodiment the heat converting substance may be contained in the oleophobic surface layer provided that said substance is homogeneously distributed therein.

The oleophobic surface layer in accordance with the present invention preferably has a thickness of at least 1.0 $\mu$m and more preferably at least 1.5 $\mu$m. The maximum thickness of the surface layer is not critical but will preferably be not more than 5 $\mu$m and more preferably not more than 4 $\mu$m. It has been found that the thickness of the oleophobic surface layer influences the printing endurance, sharpness and resolution of the printing plate.

According to the present invention the oleophobic surface layer is preferably cured and more preferably contains a hardened silicone coating. Preferably the silicone coating contains one or more components one of which is generally a linear silicone polymer terminated with a chemically reactive group at both ends and a multifunctional component as a hardening agent. The silicone coating can be hardened by condensation curing, addition curing or radiation curing.

Condensation curing can be performed by using a hydroxy terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si-H to a double bond in the presence of a catalyst e.g. platinum . Silicone coatings that can be cured according to the addition curing thus comprise a vinyl group containing polymer, a catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation cure coatings that can be used in accordance with the present invention are e.g. U.V. curable coatings containing polysiloxane polymers containing epoxy groups or electron beam curable coatings containing polysiloxane polymers containing (meth)acrylate groups. The latter coatings preferably also contain multifunctional (meth)acrylate monomers.

According to the present invention the ink repellant layer may comprise additional substances such as e.g. plasticizers, pigments, dyes etc.

According to the method of the present invention the heat mode recording material is image-wise exposed using a laser. Preferably used lasers are e.g. semiconductor lasers, YAG lasers e.g. Nd-YAG lasers, Argon lasers etc. The laser may have a power output between 35 and 40,000 mW and preferably operates in the infrared part of the spectrum. Preferably the support of the heat mode recording material is transparant and image-wise exposure proceeds through the support.

Subsequent to the image-wise exposure the heat mode recording element is developed in order to remove on the irradiated areas the oleophobic surface layer. Preferably said development is effected by rubbing said oleophobic surface layer. Rubbing can be done using e.g. a brush or a cotton pad. Rubbing of the heat mode recording material may be carried out in the presence of a solvent such a e.g. isopropanol , n.heptane or other hydrocarbon liquids when the surface layer contains a polysiloxane or more preferably in absence of a liquid. Rubbing according to the preferred modi operandi offers in addition to the ecological advantage printing plates of high resolution and sharpness.

The present invention will now be illustrated with the following examples without however limiting it thereto. All parts are by weight unless otherwise specified.

EXAMPLE 1

The following coating solution for the ink repellant layer was prepared:

| | |
|---|---|
| iso-octane | to 1000 ml |
| divinyl terminated dimethylpolysiloxane | 59.5 g |
| dimethylpolysiloxane gum | 28.2 g |
| divinyltetramethyl disiloxane complex of | |

-continued

| | | |
|---|---|---|
| platinum | 0.37 | g |
| hydride terminated dimethylpolysiloxane (DC 7048 cross-linker from Dow) | 1.79 | g |
| stabilizer (Surfinol 61 from Air products) | 0.18 | g |

The following coating solution for the recording layer was prepared:

| | | |
|---|---|---|
| ethylacetate/butylacetate (60:40)mixture | to 1000 | ml |
| Spezial Schwartz (carbon black from Degussa) | 24.6 | g |
| Solsperse 28000 (wetting agent from ICI) | 2.64 | g |
| Solsperse 5000 (wetting agent from ICI) | 0.52 | g |
| nitrocellulose | 11.87 | g |
| Cymel 301 ( melamine hardener from Dyno Cytec) | 2.14 | g |
| p-toluene sulphonic acid | 0.42 | g |

A comparitive heat mode recording material A0 was prepared by coating the above coating solution for the recording layer to a polyethylene terephthalate film support (175 μm) with a wet coating thickness of 22 μm to a dry layer thickness of 2.2 μm.

To this layer was coated the ink repellant layer from the above described coating solution to a dry thickness of 3.42 μm. Subsequent the ink repellant layer was cured for 3min. at 130° C.

Heat mode recording materials according to the invention were prepared similar to the comparative sample with the exception that the back side of the support was coated with a back side solution B. giving elements B0, with a back side solution C, giving elements C0 or with a back side solution D, giving elements D0 or the coating solution for the ink repellant layer further contained 100 mg/m$^2$ of matting agent 1, giving element A1 or contained 100 mg/m2 respectively 300 mg/m$^2$ of matting agent 2, giving element A2 respectively A2 bis or contained 100 mg/m$^2$ respectively 300 mg/m$^2$ of matting agent 3, giving elements A3 respectively A3 bis with A having the meaning as mentioned above.

The back coating B contains 233 mg/m$^2$ gelatin, 520 mg/m2 colloidal silica with a surface area of 300 m$^2$/gr and 10 mg/m$^2$ of amorphous silica with a diameter of 4 μm.

The back coating C comprises PVA, $TiO_2$ and hydrolyzed tetraalkyl orthosilicate, wherein $SiO_2$ constitutes 7.5 weight % of the total weight of said matrix, $TiO_2$ constitutes 75 weight % of the total weight of said matrix and PVA constitutes 17.5 weight % of the total weight of said matrix. The total weight of said matrix amounts to 6.8 g/m$^2$.

The back coating D comprises 200 mg/m$^2$ of a polymethyl-methacrylate latex (particles diameter between 25 and 300 nm), 20 mg/m$^2$ colloidal silica with a surface area of 100 m$^2$ /gr, 10 mg/m$^2$ of a polyethylene wax, 7 mg/m$^2$ of polystyrene sulphonic acid, 3 mg/m$^2$ of poly(3, 4-ethylenedioxy-thiophene) and 30 mg/m$^2$ of polymethyl-methacrylate matting agent with a diameter of 6 μm.

Matting agent 1 is amorphous silica with a weight average diameter between 4.3 and 5.3 μm, treated with an amide of a fatty acid (SYLOBLOC 250). Matting agent 2 is a wax-treated amorphous silica with a weight average diameter between 4.3 and 4.9 μm (SYLOID 7000). Matting agent 3 is an amorphous aluminosilicate with a weight average diameter of at most 40 μm (SYLOSIV A3). SYLOBLOC 250, SYLOID 7000 and SYLOSIV A3 are trade names from Grace Davison, Belgium.

The maximum roughness depth $R_t$ of each outer layer and the blocking of the obtained heat mode recording materials were measured. $R_t$ was measured as explained above. Blocking was measured by a visual inspection during roll-on of the film. Therefore a film with a width of 24 cm is rolled-on at a speed of 7 m/min. The mechanismus which steers the rolling-on of the film is displaced over 2 cm. The effect of this displacement on the rolled-on film is evaluated qualitatively.

| Evaluation | Result |
|---|---|
| 5 | heavy wrinkles |
| 4 | wrinkles |
| 3 | light wrinkles |
| 2 | no wrinkles, stiff recovery |
| 1 | no wrinkles, lightly stiff recovery |
| 0.5 | light effect |
| 0 | no effect |

The proofs are acceptable up to an evaluation of 2; proofs with an evaluation of 3 or more are not longer acceptable. The results for the various heat mode recording materials are given in table 1.

| Material | $R_t$ back layer | $R_t$ front layer | blocking |
|---|---|---|---|
| A0 | 0.55 | 0.17 | 5 |
| B0 | 2.18 | 0.17 | 1 |
| C0 | 1.50 | 0.17 | 1 |
| D0 | 6.11 | 0.17 | 0.5 |
| A1 | 0.55 | 0.27 | 3 |
| A2 | 0.55 | 0.39 | 3 |
| A2 bis | 0.55 | 0.71 | 0 |
| A3 | 0.55 | 1.14 | 0 |
| A3 bis | 0.55 | 1.71 | 0 |

It is clear from these results that heat mode recording material A0, A1 and A2 (comparison materials) whereof neither the outer front layer nor the outer back layer have a maximum roughness depth of at least 0.65 showed very strong or strong blocking while the other heat mode recording materials (materials according to the invention) showed a very low to none blocking. The best results are obtained when the outer front layer has a maximum roughness depth of at least 0.65.

We claim:

1. A heat mode recording material comprising on a side of a support having an oleophilic surface (i) a recording layer containing a light-to-heat converting substance capable of converting radiation into heat and (ii) an oleophobic surface layer, wherein said oleophobic surface layer and said recording layer may be the same layer and on another side of the support a backing layer containing between 175 and 750 mg/m$^2$ of gelatin, between 50 and 1000 mg/m$^2$ of colloidal silica with a surface area of at least 100 m$^2$/gr and between 1 and 100 mg/m $^2$ of amorphous silica and wherein the maximum roughness depth $R_t$ of the surface layer is at least 0.65 μm, and/or the maximum roughness depth of the outer back layer is at least 1.20 μm.

2. A heat mode recording material comprising on a side of a support having an oleophilic surface (i) a recording layer containing a light-to-heat converting substance capable of converting radiation into heat and (ii) an oleophobic surface layer, wherein said oleophobic surface layer and said recording layer may be the same layer and on another side of the support a backing layer containing between 100 and 500 mg/m$^2$ of a polymethyl-methacrylate latex, between 5 and 50 mg/m$^2$ of colloidal silica with a surface area of at least 100 $m^2$/gr, between 3 and 30 mg/$m^2$ of a polyethylene wax, between 3.1 and 12 mg/$m^2$ of polystyrene sulphonic acid, between 0.9 and 4 mg/$m^2$ of poly(3,4-ethylenedioxythiophene) and between 10 and 100 mg/$m^2$ of polymethyl-methacrylate matting agent and wherein the maximum roughness depth $R_t$ of the surface layer is at least 0.65 $\mu$m and/or the maximum roughness depth of the outer back layer is at least 1.20 $\mu$m.

3. A heat mode recording material comprising on a side of a support having an oleophilic surface (i) a recording layer containing a light-to-heat converting substance capable of converting radiation into heat and (ii) an oleophobic surface layer, wherein said oleophobic surface layer and said recording layer may be the same layer and on another side of the support a backing layer containing polyvinyl alcohol, $TiO_2$ and hydrolyzed tetraalkyl orthosilicate wherein $SiO_2$ constitutes between 7 and 30 weight % of the total weight of said layer, $TiO_2$ constitutes between 63 and 83 weight % of the total weight of said layer and polyvinyl alcohol constitutes between 7 and 30 weight % of the total weight of said layer, the total weight of said layer lying between 5 and 10 g/$m^2$ and wherein the maximum roughness depth $R_t$ of the surface layer is at least 0.65 $\mu$m and/or the maximum roughness depth of the outer back layer is at least 1.20 $\mu$m.

* * * * *